(12) United States Patent
Muljono et al.

(10) Patent No.: US 6,898,741 B2
(45) Date of Patent: May 24, 2005

(54) ARRANGEMENTS FOR SELF-MEASUREMENT OF I/O TIMING

(75) Inventors: Harry Muljono, Union City, CA (US); Alper Ilkbahar, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 417 days.

(21) Appl. No.: 10/162,671

(22) Filed: Jun. 6, 2002

(65) Prior Publication Data

US 2003/0229828 A1 Dec. 11, 2003

(51) Int. Cl.[7] .............................. G11B 5/00; G06F 11/00
(52) U.S. Cl. ....................................... 714/700; 713/503

(58) Field of Search ................................. 714/700, 744, 714/738, 798, 712, 716, 717; 713/400, 401, 500, 503; 370/249

(56) References Cited

U.S. PATENT DOCUMENTS

| 4,195,206 A | * | 3/1980 | Baichtal ..................... 370/248 |
| 5,621,739 A | | 4/1997 | Sine et al. .................. 714/724 |
| 5,943,341 A | * | 8/1999 | Gazda, Jr. ................... 370/452 |
| 6,088,829 A | * | 7/2000 | Umemura et al. ........... 714/798 |

* cited by examiner

Primary Examiner—Christine T. Tu
(74) Attorney, Agent, or Firm—LeMoine Patent Services; Dana B. LeMoine (57) ABSTRACT

Arrangements (circuits, methods, systems) having self-measurement of input/output (I/O) timing.

30 Claims, 9 Drawing Sheets

ARRANGEMENTS FOR SELF-MEASUREMENT OF I/O TIMING

CROSS-REFERENCE TO RELATED APPLICATION

Attention is directed to a related U.S. patent application Ser. No. 10/112,638, filed Mar. 29, 2002 and entitled "A METHOD AND APPARATUS FOR PRECISE SIGNAL INTERPOLATION" by inventors Eddie Y. WANG and Harry MULJONO.

FIELD

The present invention is directed to arrangements for self-measurement of input/output (I/O) timing.

BACKGROUND

Manufacturers of semiconductor chips often perform extensive testing of the functionality of each chip before shipping it to its customers. This is important to the customer, since the use of a bad chip may ruin a larger assembly. The testing may involve a number of different parameters and functions of the chip, such as pin timing parameters. Due to increasingly stringent specifications of pin timing, the testing of these parameters and functions is becoming more difficult and more involved, and may require the use of increasingly expensive testing equipment. In addition, as the bus speeds increase, it becomes increasingly difficult and expensive for testing equipment (built with prior generation (slower) chips) to test the faster functions of a newer generation (faster) chip. Further, when testing very short functions (such as those involving the input setup time of a signal), the time period necessary for testing may assume a large part of the entire test period. Accordingly, it would be helpful to be able to test the chip without resorting to external testing equipment, such as by performing internal tests, so that expensive testing equipment can be avoided or use thereof minimized, and so that newer generation chip speeds do not impact testing.

One concept useable in this regard is called I/O loop-back (IOLB) testing. In this arrangement, an output pad is connected to an output latch through a driver, and also connected to an input latch through a buffer, so as to form a loop-back path. In order to test the speed of the device, the time required to send the data out and receive it back via the loop-back path is determined. This also tests data integrity, i.e., whether the output latch and input latch correctly output and input the applied signals.

One such type of system was used in U.S. Pat. No. 5,621,739, which shows a method for a buffer self-test. The buffer circuit utilizes an adjustable delay circuit to test whether the buffer can capture a data value during a variable strobe window. A self-testing buffer circuit generates a data value, and a latch then receives such data value. An adjustable delay circuit provides an adjustably delayed strobe to a clock input of the latch. A comparison circuit compares the latch output value to an expected value. A failure is indicated when the value is not that which is expected.

While these kinds of systems avoid some of the previously noted problems, they still have not been completely successful in removing all of these problems. One of the unsolved problems is related to the use of different clock domains for generating test data and test strobe. As a result, the data and strobe can only be exercised in a single-shot, non-repetitive manner. To guarantee correct operation, the logic has to ensure proper alignment between the clocks that generate the test data and strobes. Running the test operation during clock misalignment may cause failures that are not the fault of the chip being tested. Thus, good chips may be thrown out as being defective, or the ability to test the device must be limited so that these errors are not introduced.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Before beginning a detailed description of the present invention, mention of the following is in order. When appropriate, like reference numerals and characters may be used designate identical, similar or corresponding components in differing Figure drawings. Further in the detailed description to follow, example sizes, values, ranges and models may be given although the present invention is not limited to the same. Well-known power and ground connections to ICs and other components may not be shown within the Figures for simplicity of illustration and discussion and so as not to obscure the invention. Further, arrangements may be shown in block diagram form in order to avoid obscuring the invention and also in view of the fact that specifics with respect to implementation of such block diagram arrangements are highly dependent on the platform within which the present invention is to be implemented, i.e., such specifics should be well within the purview of one skilled in the art. Where specific details are set forth in order to describe an example embodiment of the invention, it should be apparent to one skilled in the art that the invention can be practiced without, or with variation of, these specific details. Finally, it should be apparent the differing combinations of hard-wired circuitry and software instructions may be used to implement embodiments of the present invention.

Although example embodiments of the present invention will be described using, for example, system block diagrams in a semiconductor integrated circuit (IC) chip environment, practice of the invention is not limited thereto, i.e., the invention may be able to be practiced in other environments.

Figure 1:
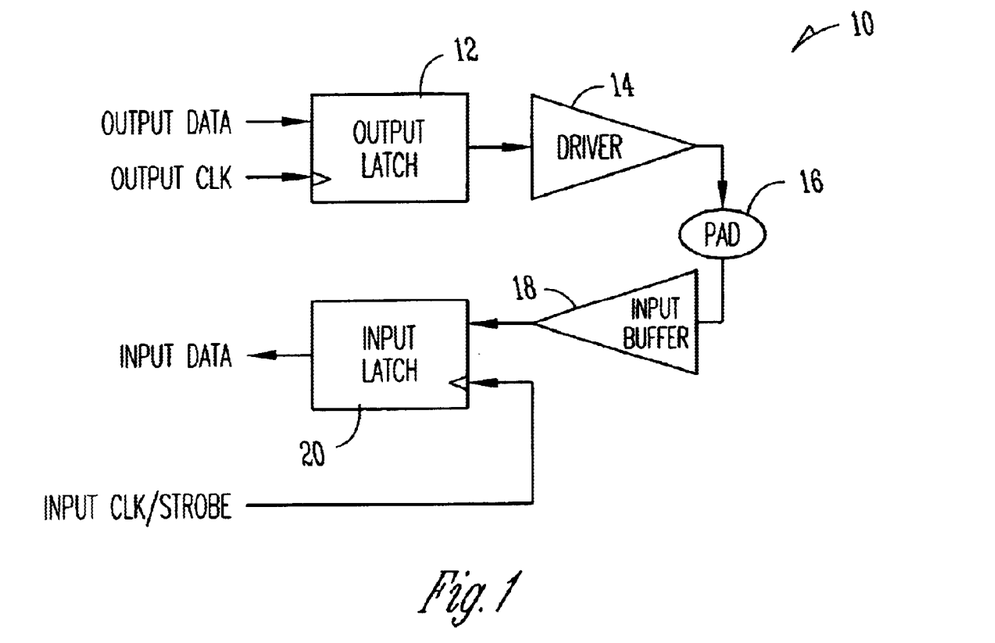
FIG. 1 is an example background arrangement useful in gaining a more thorough understanding of the present invention.

FIG. 1 shows an example background I/O loop-back circuit for one input/output (I/O) pad of a device (e.g., IC chip), where such circuit may be implemented using semiconductor structures (e.g., doping, logic components, metal wiring, etc.). Whereas in practice a device may contain several tens and even several hundreds of I/O pads, for the sake of brevity and clarity, FIG. 1 focuses only on one pad. Thus, it should be understood that the FIG. 1 loop-back circuit may be applied to all or fewer than all of the I/O pads of a device.

In this figure, the device 10 shows an output latch 12 receiving inputs of both data and clock signals. The output latch latches the data signal under the control of the clock signal and generates an output that is received by a driver 14. The driver outputs the signal to the output pad 16. This signal is also looped-back to an input buffer 18. The signal is then latched into an input latch 20 under the control of an input clock strobe signal to generate the input data signal. In doing this, it is possible (e.g., utilizing an appropriate comparison arrangement such as a comparator) to check to see that the latched input data matches output data that was sent to the output latch. Thus, this arrangement does not directly measure any specific timing specification but only measures the combination of the output delay, the loop path delay and the input delay.

Figure 2:
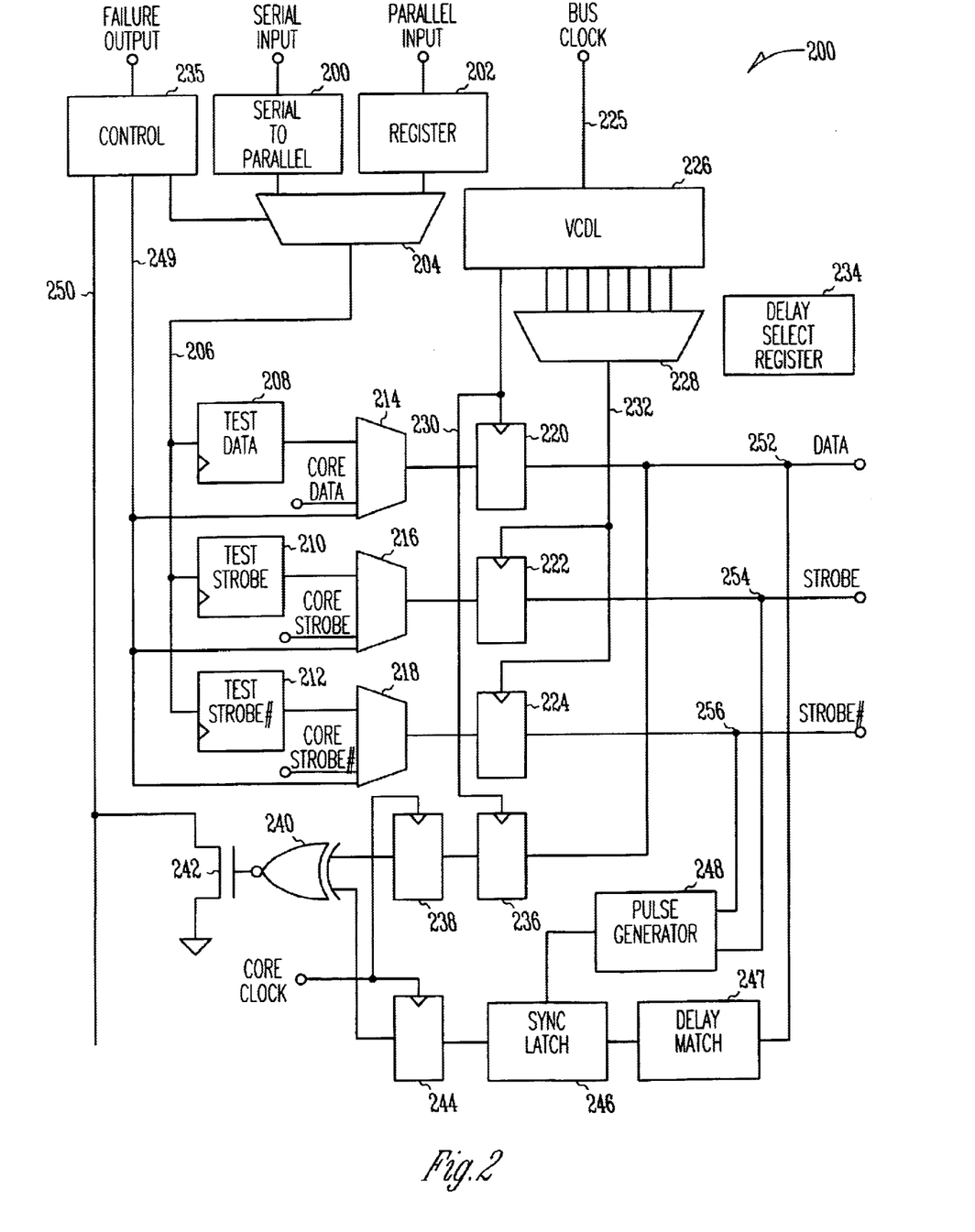
FIG. 2 is another example background arrangement useful in gaining a more thorough understanding of the present invention.

FIG. 2 is an example background arrangement 200 useful in gaining a more thorough understanding of the present invention. In this system, a buffer is tested by using a strobe signal to create a window during which data should be able to be captured. An adjustable delay circuit is used to test whether the buffer can capture a data value during a variable strobe window. In this system a control device 235 controls a multiplexer 204 to couple a serial input from a serial-to-parallel converter 200 or a parallel input from a register 202, to the test register bus 206. This bus couples to the input of a plurality of test registers 208, 210 and 212. Test register 208 is coupled by multiplexer 214 to an output circuit indicated by latch 220. A control signal 249 from the control circuit causes the multiplexer to make the connection during the test mode. Likewise, multiplexer 216 connects the test strobe register 210 and latch 222, while multiplexer 218 connects test strobe # register 212 and latch 224 during the test mode, with both the multiplexer 216 and 218 also being controlled by a control signal 249 from the control 235.

Output circuits 220, 222 and 224 may be any type of buffer or latch that drives an output signal in response to a clock, strobe or enable signal. Latch 220 drives a value from the data test register 208 to the node 252 as data, in response to a first I/O clock on line 230. The strobe and strobe# signals are driven from register 210 and 212 to nodes 254 and 256 in response to a second I/O clock line 232. The clock signals are derived from a bus clock provided on line 225. A voltage controlled delay line (VCDL) 226 acts as an adjustable delay circuit to skew the second clock relative to the first by adjustably delaying the second clock. A multiplexer 228 use a value from the delay select register 234 to select an output from one of a plurality of stages of the delay line as the second clock. Thus, the timing of the strobe and strobe # signals at nodes 254 and 256 is controlled by selecting a particular tap in the delay line.

The variably delayed strobe and strobe# signals are provided to pulse generator 248 which provides pulses to a synchronizing latch circuit 246. A delay matching circuit 247 may be coupled between the node 252 and the synchronizing latch 246 circuit to compensate for any pulse generator delay in the strobe signal paths.

In order to capture the incoming data from the node 252, the pulse generator circuit 248 provides a plurality of pulses to a series of latching circuits inside the synchronizing latch 246 circuit. The strobe and strobe # signals are used to generate rising and falling edges of each of the plurality of pulses to provide a more reliable capture window. Each pulse is delayed slightly with respect to previous one. Latch circuits within the synchronizing latch circuit are coupled to a core-clocked latch 244, which receives a core clock signal. The latching circuits are sequentially selected using a multiplexer to provide synchronized incoming data to the latch 244.

A latch 238 is also clocked by the core clock signal. Latch 238 contains an expected value by feeding back the data value from a test feedback latch 236 that couples the test data from a node prior to node 252. An exclusive nor gate 240 receives values from latches 238 and 244. If the values do not match, transistor 242 provides an indication of failure on the failure indication line 250. Responsive to a failure on the failure indication line 250, the control block 235 can output a failure output.

The buffer may be tested over a range of delays to provide complete information about the chip. Thus, the adjustable delay circuit can cause failures due to a strobe signal that is either too early or too late. Both the input setup and hold times (both sides of the capture window) can be tested. An entire range of delays can be tested for an I/O buffer if desired. It may be desirable to vary the delay control signal until the input latch fails to capture the input. This may be useful in defining production test specifications. Accordingly, this type of system may be very useful in testing compliance with specifications of the buffers on a device (e.g., chip).

The disadvantageous arrangement described in FIG. 2 has limitations because of the use of the bus strobe clock. When changing the delay in order to change the strobe window between the bus strobe clock and the core clock, that is used to toggle latches 208, 210 and 212, the setup and hold time of the test data and test strobe at latch 220, 222 and 224 may be violated which can cause the chip to fail through no fault of its own. That is, there are multiple clock domains in use within iolb operations of the FIG. 2 iolb arrangement. As result, the amounts of delay that are available for testing may be limited or good chips may fail unnecessarily.

In addition, the arrangement in FIG. 2 also allows only one-shot, one-bit testing patterns. To exercise another pattern, test data and test strobe registers have to be reloaded with a new pattern, extending the testing time unnecessarily.

Example embodiments of the present invention, as shown with respect to FIGS. 3–6, avoid ones of the above problems by avoiding the use of a system bus strobe clock (i.e., uses a locally-generated non-system-bus-clock) for test data and test strobe within the iolb circuit. This allows the entire iolb operation to be done in one local (i.e., a common) clock domain. Also, since the timing loop may be locked to a constant test frequency, there are no changes in silicon variables such as PVT (process, voltage, temperature) that may affect the strobe timing.

With this type of arrangement, it becomes possible to utilize multiple test patterns, rather than being limited to a single test pattern as in FIG. 2. That is, a pattern generator register may be provided to service each pin, so that multiple patterns may be generated and used without extending any testing time for reloading.

Thus, a purpose of the present invention is to add a capability to the chip to do a self-measurement of I/O timing and to test for buffer defects without the need for separate external testing equipment. During measurement, dedicated data and strobe clocks within a single time domain as generated by a dedicated local (iolb) time locked loop (TLL) such as a delay locked loop (DLL), may be used to trigger the output data and strobe transitions. The term dedicated, as used within the previous sentence, means that the TLL and iolb data and strobe clocks are used mainly to service the iolb arrangement/operations, but may be used for some smaller secondary purposes. As further evidence of the iolb-specialized nature of the clock component/signals, the TLL and iolb data and strobe clocks may be rendered inactive during non-iolb times.

Continuing discussions, by varying the strobe clock in relation to the data clock, it is possible to determine at what points the latches start to fail and then completely fail to latch the data. Because the clocks are generated by a TLL (e.g., DLL), the timing step is precise and PVT is completely compensated for. By using this arrangement, the use of separate external (expensive) functional testers is avoided. That is, a first iolb clock and a second iolb clock may be generated having a substantially precise time-lockable relationship to one another, and may be useable for substantially time-locked travel/capture of test data along at least one iolb path.

Figure 3:
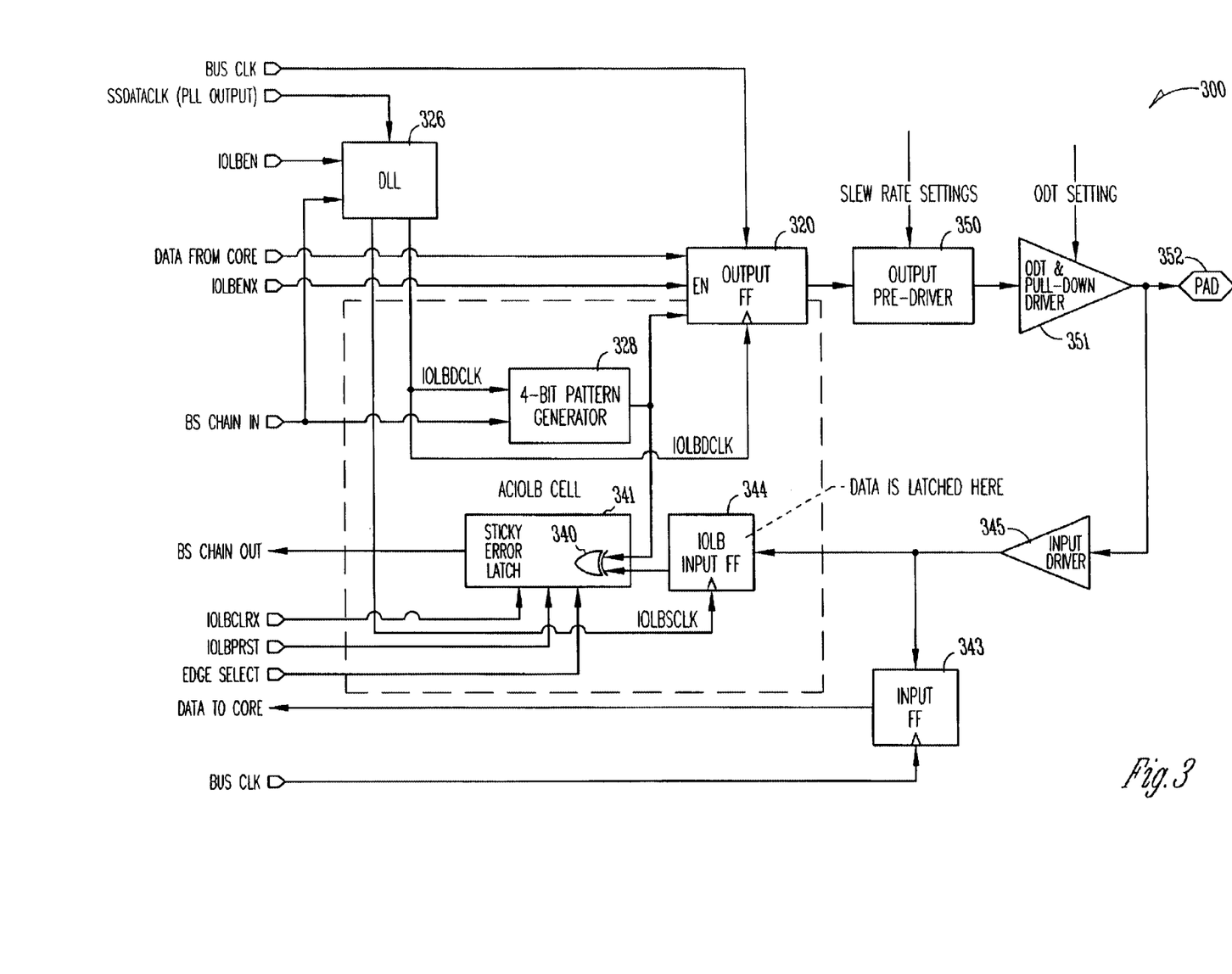
FIG. 3 is an example circuit diagram of an advantageous example (common clock) embodiment of the present invention.

FIG. 3 is an example circuit diagram of an advantageous, example (common clock) embodiment 300 of the present invention. Again for the sake of simplicity and brevity, FIG. 3 focuses only on one pad, although it should be understood that the FIG. 3 iolb circuit may be applied to all or fewer than all of the I/O pads of a device. Within the example embodiment 300, a DLL 326 is enabled during I/O loop-back (iolb) testing using an iolb enable signal (iolben), to generate two (local) iolb clock signals during iolb testing, i.e., an I/O loop-back data clock (iolbdclk) and an I/O loop-back strobe clock (iolbsclk), derived, for example, from a system's source synchronous data clock (ssdataclk). The DLL 326 may operate according to preprogrammed settings, and/or, may be able to be loaded with desired settings as indicated by the FIG. 3 notation bs chain in. Settings for the DLL 326 are dependent upon a platform upon which the present invention is implemented, and should be well within a purview of those skilled in the art.

Practice of the present invention is not limited to DLL (as was mentioned previously above), or to utilizing the system's source synchronous data clock (ssdataclk) clock. These iolbdclk and iolbsclk clocks are used during loop-back testing to trigger, for example, transitions in the data and strobe latches of the system.

Figure 7:
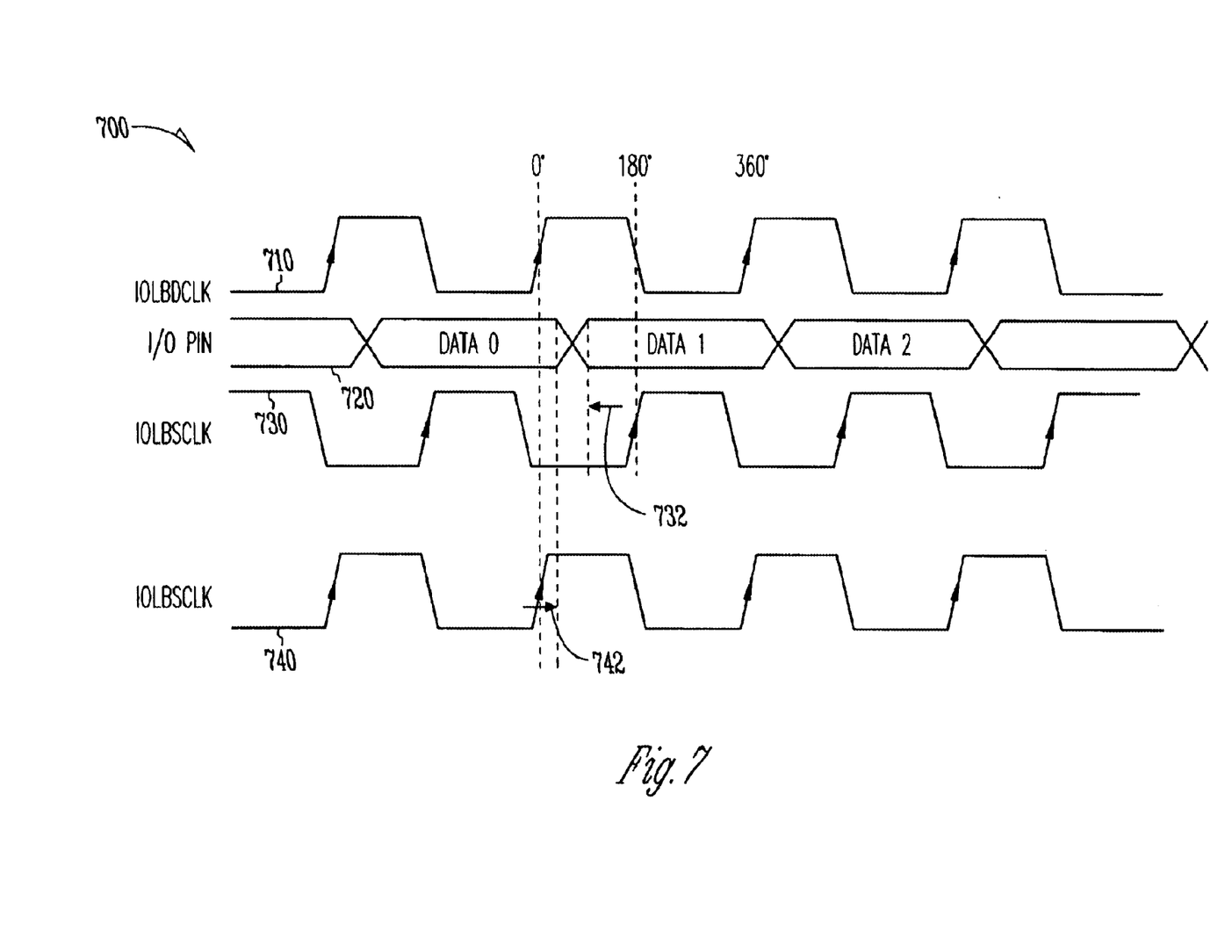
FIG. 7 is an example timing diagram useful in explanation and understanding of all-cycle and first-cycle fails during testing using embodiments of the present invention.

The iolbdclk and iolbsclk clocks may be varied in relation to each other to change the strobe window. FIG. 7 simplistically illustrates a timing diagram 700 showing example strobe window variations, as well as all-cycle and first-cycle fail incidents using embodiments of the present invention. As one example of varying a strobe window, data clock iolbdclk 710 may be set to a constant zero degrees while the strobe clock iolbsclk timing can be varied between zero and 360 degrees. An example iolb I/O data is shown as data 720. In practice, iolbsclk 730 may be initially set at 180 degrees and a test may be run to determine if the data will latch. It will normally fail at this point, as will be described later. The variation (e.g., delay) of iolbclk 730 may then be slowly decreased (shown representatively by the FIG. 7 arrow 732) by steps and additional tests run at each step until a time having a successful iolb data latching is detected. This determines the last time that all failures are detected, and thus an "all-cycle-fail" point may be detected. As another (different) test, iolbsclk 740 may then be set to zero degrees and a test may be run which will normally be successful. The delay value of iolbsclk 740 may then be slowly increased (shown representatively by the FIG. 7 arrow 742) and additional tests run until such time as a failure is detected. This determines the first time that the failure is detected, and may be termed a "first-cycle-fail". Thus, using the above, the boundaries of the success and failure ranges may be detected.

Returning to FIG. 3, a four-bit pattern generator 328 may receive the iolbdclk signal from the DLL. Pattern generators having a different number of bits could also be used. The pattern generator 328 may operate according to preprogrammed settings, and/or, may be able to be loaded with desired settings as indicated by the FIG. 3 notation bs chain in. Settings for the pattern generator 328 are dependent upon a platform upon which the present invention is implemented, and should be well within a purview of those skilled in the art. Further, the pattern generator 328 may itself generate a predetermined pattern(s), or alternatively, may be loaded with a desired pattern as indicated by the FIG. 3 notation bs chain in. An example iolb test may include one or more of the following possible test patterns, although practice of the present invention is not limited to the same: all zeros (0); all ones (1); alternating zeros and ones; a single zero; a single one; etc.

A bit from the data output pattern is sent to output flip-flop 320, and in turn (responsive to iolbdclk clocking), is transmitted to the I/O data pad 352 via a predriver 350 (controlled by predetermined slew rate settings) and driver 351 (controlled by ODT settings). Since the pattern generator produces a four bit signal, 16 possible patterns may be produced. Accordingly, the pattern generator 328 may service, for example, 16 different data pads which may be tested at the same time.

As to the pre-driver 350 and driver 351 located between the data flip-flop 320 and the data pad 352, such are optional and may be utilized to establish slew rate settings and other settings while driving the data signal to the pad. Differing settings may be able to be set within pre-driver 350 and driver 351 for iolb testing, as opposed to settings during normal I/O operations.

The I/O pad 352 may also be connected to input driver 345 to receive the signal as an input in a loop-back fashion. The iolb data is then received in a normal input latch 343 and iolb input latch 344. (Normal input operations with respect to the normal input latch 343 will be described further ahead.) The iolb input latch 344 is clocked by the iolbsclk signal from DLL 326. Exclusive or circuit 340 of a sticky error latch 341 determines whether the looped-back data in latch 344 corresponds to the input data from pattern generator 328. That is, the internally-known iolb data is driven through the output latches and drivers toward the pad, sampled back through input drivers and latches and compared with a copy of the same iolb data, with signal generation, travel and testing all being conducted using the iolb-DLL generated data/strobe clocks.

Initiation of comparison within the sticky error latch 341 may be triggered by a signal iolbclrx at a time when it is known that first iolb data inputs become available and stable at exclusive or gate 340, e.g., at a falling edge of a $2^{nd}$ iolbdclk signal. Operation of the sticky error latch 341 may be further controlled via an edge select signal as shown in FIG. 3. The sticky error latch 341 notes any errors and holds them (thus "sticky") for future reference, and such error data can be read out to the core for analysis as indicated by the FIG. 3 notation bs chain out. The cumulative set of errors noted determines the parameters of the I/O timing of the chip and whether the desired specifications have been met. As shown in FIG. 3, the sticky error latch 341 may be able to be preset by a signal iolbprst.

Thus, with the FIG. 3 example embodiment, existing I/O pads (together with appropriate internal iolb testing circuitry) are used to test themselves for proper functioning (e.g., component operations; path integrity) and timing.

Figure 4:
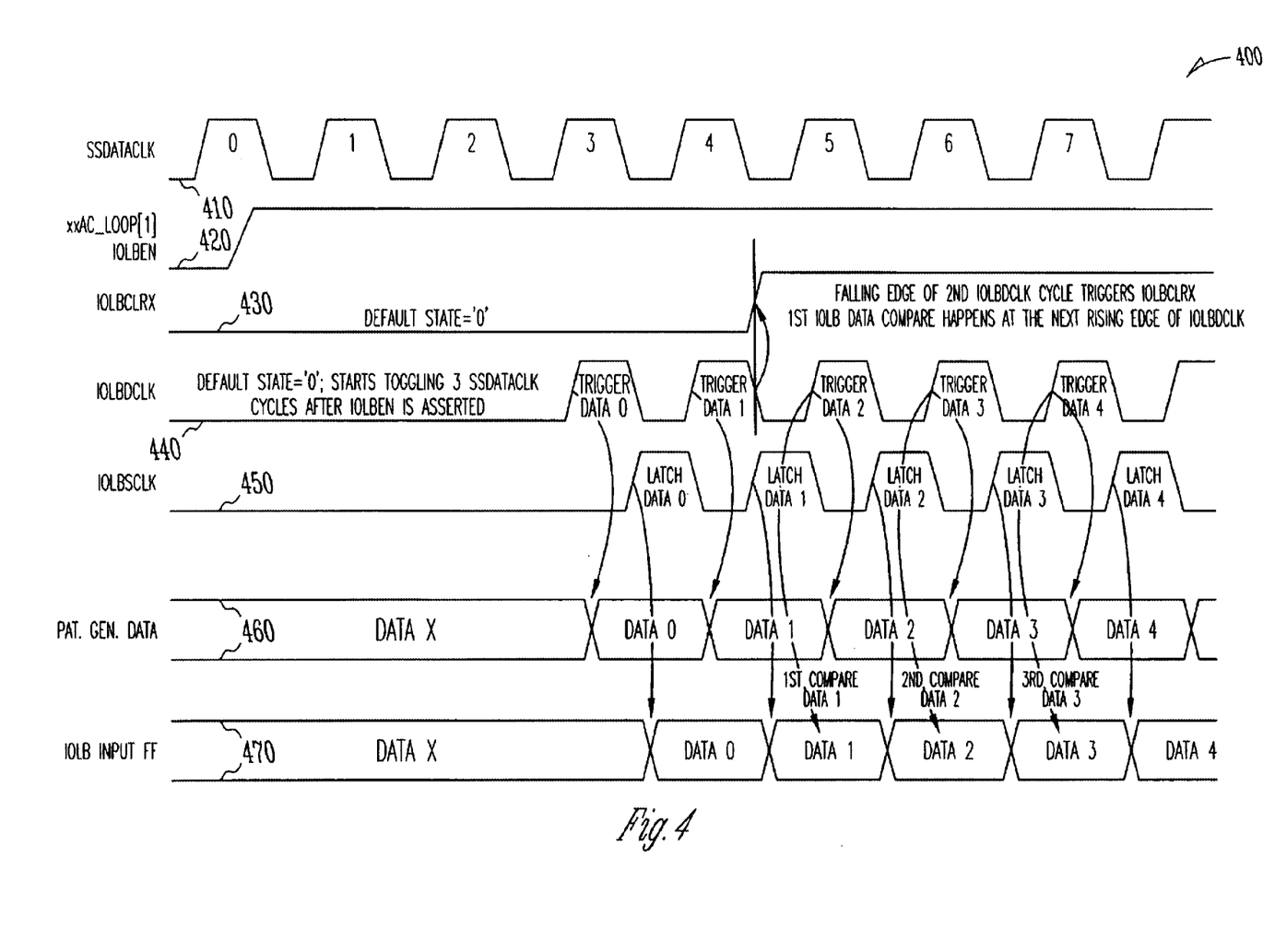
FIG. 4 is an example timing diagram of the example embodiment shown in FIG. 3.

FIG. 4 is an example timing diagram 400 of the various signals of the example embodiment shown in FIG. 3. More particularly, shown is the system's (core's) source synchronous data clock ssdataclk 410, and also ones of the iolben 420, iolbclrx 430, iolbdclk 440, iolbsclk 450, pattern generator data 460 and iolb flip-flop 470 signals in example relation to one another. Of particular interest, the phase of the iolbsclk 450 signal may be varied with respect to the iolbdclk 440, as was described previously with respect to FIG. 7. Further, the pattern generator data signal 460 may have a longer cycle than that of the clock signals. When the data signal changes, a transition area is defined. It is this transition area that is being sought by the testing. When the iolbsclk 450 signal is set at 180 degrees, the data signal is low and is not recovered in the latch. As the clock signal is reduced, the rise in iolbsclk 450 occurs earlier and eventually approaches from the right to the point at which the data level starts to rise. At this point, a first successful test will be noted and this point will be established. Then iolbsclk 450 may be set to zero degrees (in a manner similar to that previously described by signal 740 in FIG. 7) so that the data signal will be high and a test will be successful. As the strobe clock increases in value, the point on the data signal where it starts to decrease from high to low will be encountered and a first failure will be detected. Accordingly, boundaries of the transition area will then be determined.

Figure 9:
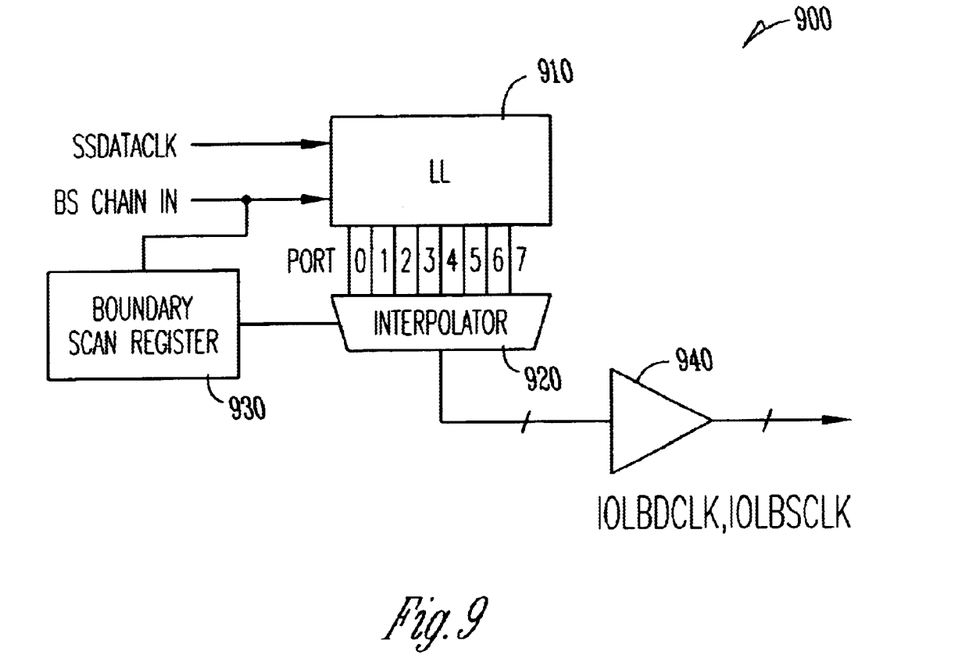
FIG. 9 is a block diagram of an example delay locked loop (DLL) arrangement useable with embodiments of the present invention.

To summarize, this new arrangement utilizes a dedicated (local iolb) PVT-independent timing loop circuitry to generate loop-back data and strobe clocks. Thus, during iolb testing, the I/O paths become decoupled from the core, enabling a loop-back operation to be entirely independent. The iolb test frequency may be set, for example, using the FIG. 3 indicated bs chain in input. FIG. 9 illustrates an example embodiment setup 900 for the FIG. 3 DLL. More particularly, shown is a locked-loop (LL) 910 receiving both the ssdataclk and bs chain in signals, where appropriate information within the bs chain in signal may be used to set a frequency of LL 910. The LL 910 may be lowered to a package resonant frequency or increased to a higher testing frequency without affecting core paths which are running at a constant core frequency. A boundary scan register 930 also receives the bs chain in signal, where appropriate information within the bs chain in signal may be used to set boundaries thereof. An interpolator (e.g., multiplexer) 920 receives, for example, clock signals at eight (8) different timings from ports 0–7 of the LL 910, and responsive to control information from the boundary scan register 930, outputs (e.g., on separate clocking lines) the iolbdclk and iolbsclk signals through driver(s) 940.

The above arrangements facilitate testing for each edge of the data signal separately so as to completely characterize the timing distribution as a function of transition type. This also allows rise time and fall time as well as rise and fall delay to be tested and thus characterized separately. That is, first time differences between the data and clock signals may be used to test for a rising edge of one of the signals, whereas second time difference may be used to test for a falling edge of the signal.

In addition to iolb testing, the FIG. 3 embodiment also accommodates normal (non-iolb) I/O operations. That is, the DLL 326 (and thus the pattern generator 328 and iolb input flip-flop 344) is enabled on (via the iolben signal) only during an iolb testing procedure, and off during normal I/O operations and therefore does not affect normal (non-test) I/O operations of the system. Thus, the components 326, 328, 344, 340, 341 are essentially rendered inactive, and may even be constructed to be powered-down during non-iolb operations for a power-savings measure. During normal (non-iolb) operations, differing clock signals (e.g., a bus clock) may be used (alternatively to iolbdclk and/or iolbsclk) to clock ones of the components of a normal I/O path. On an output side, output flip-flop 320 may be selected via an iolb enable x signal (iolbenx) to be clocked via a bus clk, as opposed to being clocked by iolbdclk during iolb testing. Further, during normal output operations, the output flip-flop 320 would receive data from a chip core, as opposed to data from the pattern generator 328. During normal input operations, input (pad) data to the core would be inputted through the input flip-flop 343 which is clocked by the bus clk.

All of the FIG. 3 components/paths may be implemented as part of a semiconductor die, so as to facilitate self-test of such semiconductor die.

The FIGS. 3–4 common clock example embodiment works well at a lower range of clocking frequencies, e.g., up to 200 MHz. That is, at such lower range of clocking frequencies, negligible skew may exist between a phase of iolb data signal arriving at the iolb input flip-flop 344 and the iolbsck signal driving the clock input of the iolb input flip-flop 344. At higher-and-higher clocking frequencies, the skew therebetween may become less-and-less negligible. Discussion now turns to another FIGS. 5–6 example embodiment which works well at both the lower range and a higher range of clocking frequencies, e.g., at 200+MHz.

Figure 5:
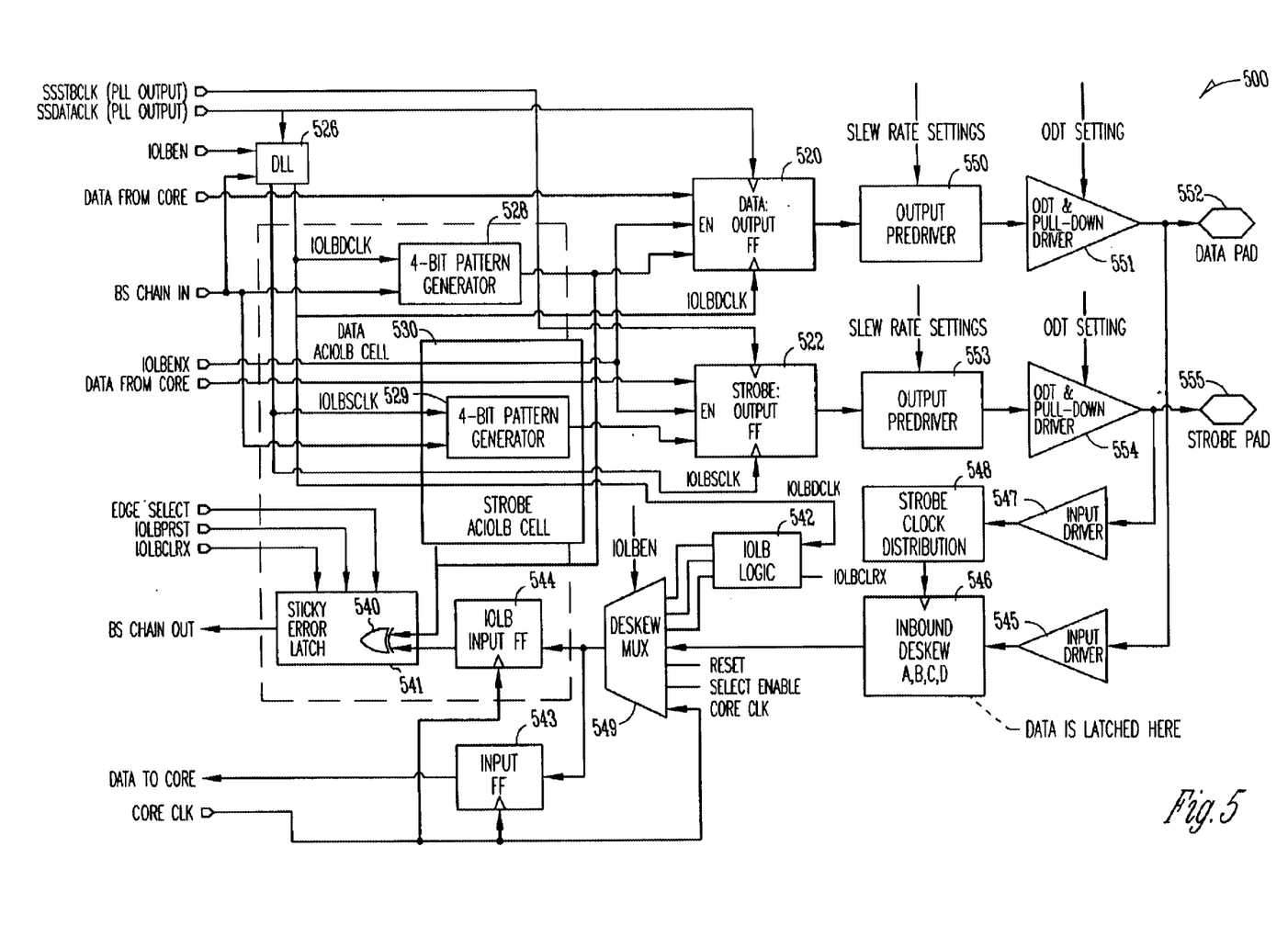
FIG. 5 is an example circuit diagram of an advantageous example (source synchronous) embodiment of the present invention.
Figure 6:
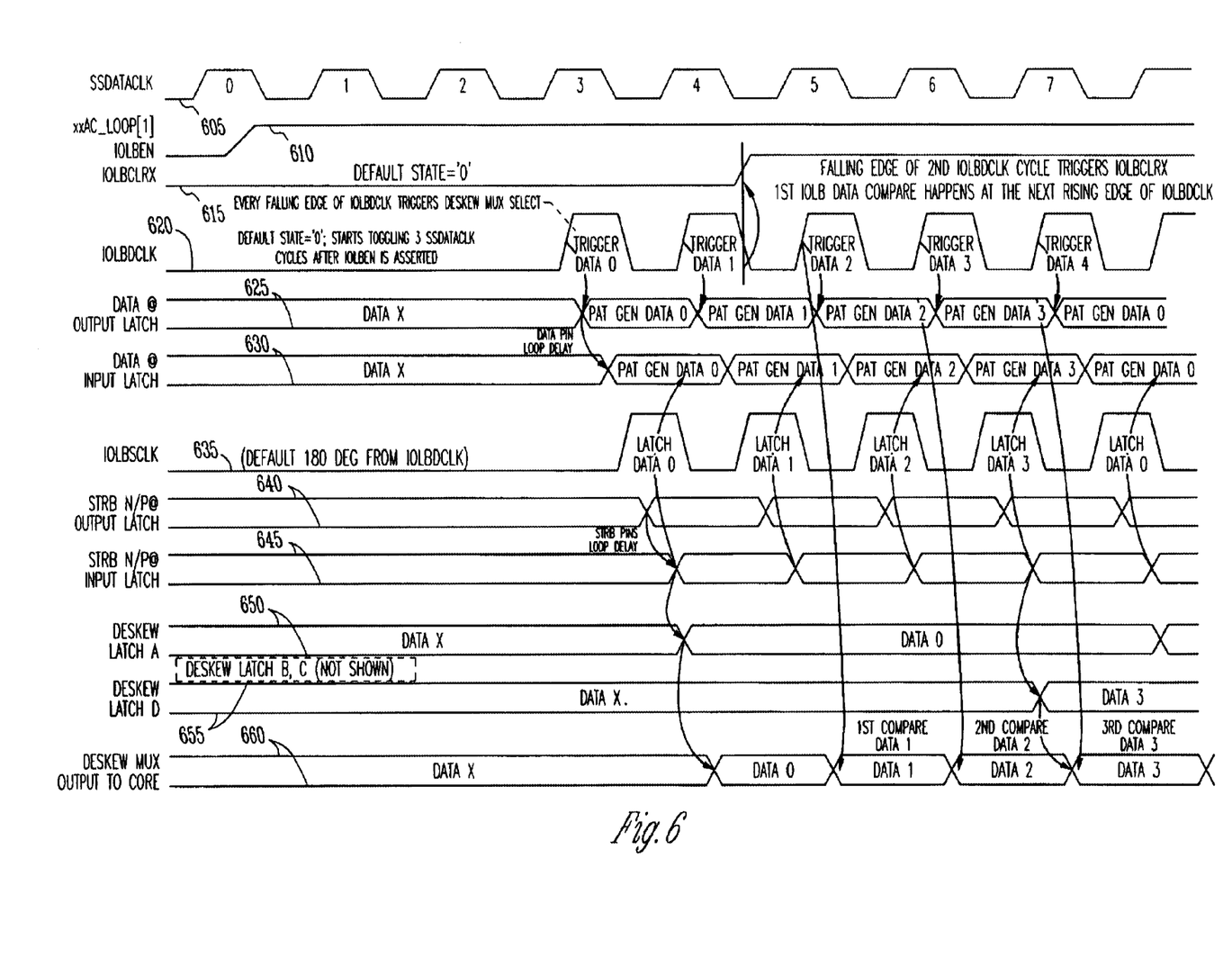
FIG. 6 is an example timing diagram of the example embodiment shown in FIG. 5.

More particularly, FIG. 5 is an example circuit diagram 500 of an advantageous source synchronous embodiment of the present invention, whereas FIG. 6 is an example timing diagram of example signals existing within the FIG. 5 example embodiment. In addition to a data loop-back path (similar to that of the FIG. 3 embodiment) for the iolb operations, the FIG. 5 example embodiment further includes strobe iolb path/arrangements. As was the case with FIG. 3, again for the sake of simplicity and brevity, FIG. 5 focuses only on one set of pads, although it should be understood that the FIG. 5 iolb circuit may be applied to all or fewer than all of the I/O sets of pads of a device.

Turning first to data iolb, portions of the FIG. 5 data iolb path are similar to portions of the FIG. 3 data iolb path, so redundant discussion thereof is omitted for sake of brevity. More particularly, along a data loop-back path, the FIG. 5

DLL 526, pattern generator 528, data output flip-flop 520, output pre-driver 550, output driver 551, data pad 552, input driver 545 (with the exception of outputting to a differing inbound deskew latch 546 (discussed more ahead)), iolb input flip-flop 544 (with the exception of receiving differing inputs from a deskew multiplexer 549 (discussed more ahead) and a core clock (clk)), normal input flip-flop 543 (with the exception of receiving differing inputs from the deskew multiplexer 549 and core clock (clk)), and sticky error latch 541 (including the gate 540), are similar in construction/operation to the FIG. 3 DLL 326, pattern generator 328, data output flip-flop 320, output pre-driver 350, output driver 351, data pad 352, input driver 345, iolb input flip-flop 344, normal input flip-flop 343 and sticky error latch 341 (including the gate 340), respectively.

Discussion turns first to the FIG. 5 further strobe iolb path/arrangements. More particularly, further included is a strobe aciolb cell 530 including a (e.g., 4-bit) pattern generator 529 that receives the iolbsclk signal from the DLL. The pattern generator 529 may operate according to preprogrammed settings, and/or, may be able to be loaded with desired settings as indicated by the FIG. 5 notation bs chain in. Settings for the pattern generator 529 are dependent upon a platform upon which the present invention is implemented, and should be well within a purview of those skilled in the art. The pattern generator 529 may itself generate a predetermined pattern(s), or alternatively (like the pattern generator 528), may be loaded with a desired pattern as indicated by the FIG. 5 notation bs chain in. Again, an example iolb test may include one or more of the following possible test patterns, although practice of the present invention is not limited to the same: all zeros (0); all ones (1); alternating zeros and ones; a single zero; a single one; etc.

Although the pattern generator 529 (like the pattern generator 528) is illustrated as being, for example, a 4-bit pattern generator, a pattern generator having a different number of bits may also be used. Since the pattern generator 529 produces a four bit signal, 16 possible patterns may be produced. Accordingly, the pattern generator 529 may service 16 different strobe iolb paths/pads that may be tested at the same time. One bit of the generated strobe output pattern is sent to strobe output flip-flop 522 (similar to the data ouput flip-flop 520, but receives iolbsclk as an iolb latching signal as opposed to iolbdclk), an output pre-driver 553, output driver 554, strobe (output) pad 555 and input driver 547. A data iolb arrangement and its corresponding (mated) strobe iolb arrangement may be called a data/strobe iolb pair.

The length/arrangement of the iolb strobe path is desireably a substantially electrically equivalent to the (e.g., majority) portion of the iolb data path to which it electrically parallels, i.e., to keep the data and strobe signals in sync with each other. In order to minimize skewing between iolb data and strobe signals traveling in the respective iolb data and strobe signal paths of a given data/strobe iolb pair, the construction/operation and data path lengths of/between the pattern generator 529, strobe output flip-flop 522, output pre-driver 553, ouput driver 554, strobe (output) pad 555 and input driver 547 of the pair may be similar to those of the aforementioned data output flip-flop 520, output pre-driver 550, output driver 551, data (output) pad 552 and input driver 545 of the pair, respectively. To even further minimize skewing that may be caused by semiconductor process variations, temperature variations, voltage/current level variations, noise, etc., all components/paths for a pair may be formed at similar times during the same semiconductor manufacturing operations (so as to be formed in a same manufacturing environment), and may be provided in substantially a same area of a semiconductor die (so as to be exposed to substantially a same operating environment). Even with careful precautions, in practice, perfect matching is difficult, so some skewing may occur between data and strobe signals arriving at locations near the end of iolb strobe path.

Continuing discussions, an iolb strobe signal output of the input driver 547 is received by a strobe clock distribution 548 component, and an iolb strobe clock is then applied to a clock input of an inbound deskew 546 component. The timing position of the strobe clock determines whether the deskew latch 546 is able to capture the incoming data. Latch 546 may include four separate latches which can capture the data at four different time periods (e.g., A, B, C, D). A multiplexer 549 may select the data in each of the latches sequentially under the control of logic circuit 542 (which receives the iolbdclk and iolbclrx signals). Operations of the multiplexer further may be controlled by iolben, reset and select enable inputs. Data outputted by the multiplexer 549 may be received in latches 543 and 544. In a manner similar to that which was described previously with respect to FIG. 3's components 340 and 341, the exclusive or circuit 540 of the sticky latch 541 may detect, save and output errors to the chip's core for analysis.

FIG. 6 is an example timing diagram 600 of the various signals of the example embodiment shown in FIG. 5. More particularly, shown is the system's (core's) source synchronous data clock ssdataclk 605, and also ones of the iolben 610, iolbclrx 615, iolbdclk 620, data @ output latch 625, data @ input latch 630, iolbsclk 635, strb n/p @ output latch 640, strb n/p @ input latch 645, deskew latch A 650, deskew latch D 655 and deskew mux output to core 660 signals, in example relation to one another. Operation and notes of particular interest are similar to those discussed previously with respect to the FIG. 4 timing diagram.

In addition to iolb testing, the FIG. 5 embodiment also accommodates normal (non-iolb) I/O operations. That is, the DLL 526 (and thus the pattern generator 528, pattern generator 529) is enabled on (via the iolben signal) only during an iolb testing procedure, and off during normal I/O operations and therefore does not affect normal (non-test) I/O operations of the system. Thus, the components 526, 528, 529, 544, 540 and 541 are essentially rendered inactive, and may even be constructed to be powered-down during non-iolb operations for a power-savings measure. During normal (non-iolb) operations, differing clock signals (e.g., a system's (core's) ssdataclk and ssstbclk) may be used (alternatively to iolbdclk and/or iolbsclk) to clock ones of the components of a normal I/O path. On an output side, for example, data output flip-flop 520 can be selected via an iolb enable x signal (iolbenx) to be clocked via ssdataclk, as opposed to being clocked by iolbdclk during iolb testing. Further, during normal output operations, the output flip-flop 520 would receive data from a chip core, as opposed to data from the pattern generator 528. Likewise, strobe output flip-flop 522 can be selected via the iolb enable x signal (iolbenx) to be clocked via ssstbclk, as opposed to being clocked by iolbsclk during iolb testing. Further, the output flip-flop 520 would receive data (a strobe) from a chip core, as opposed to data from the pattern generator 529. During normal input operations, the input driver 547, strobe clock distribution block 548 and deskew block 546 would be responsive to any strobe input applied to the strobe pad 555. Further, the iolb logic 542 and deskew multiplexer 549 would be set so as to pass incoming data to the input flip-flop 543, as clocked by the core clk.

Figure 8:
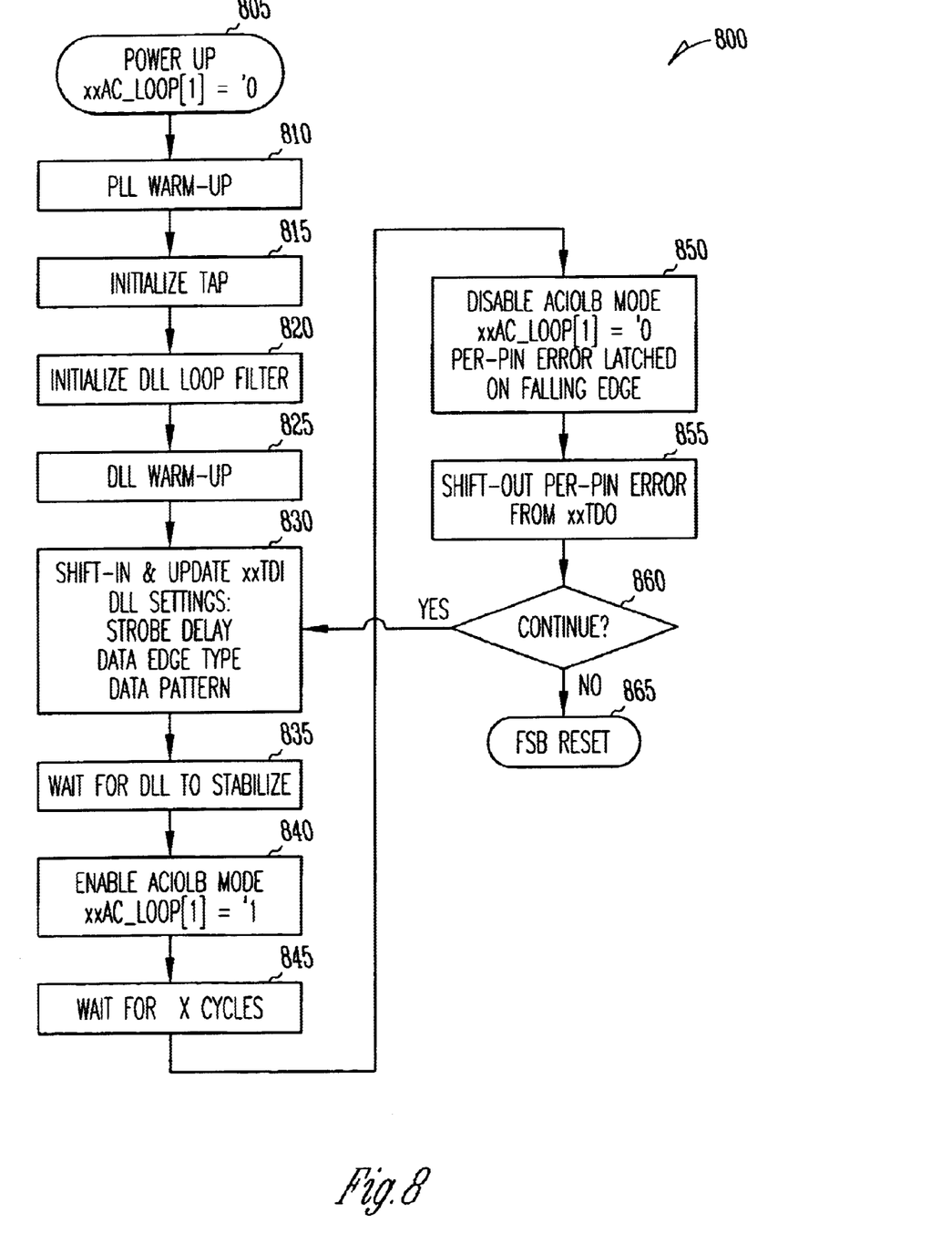
FIG. 8 is an example flow diagram of example operations useable with embodiments of the present invention.

FIG. 8 is an example flow diagram 800 of example operations useable with embodiments of the present invention. At block 805, power up is conducted, and a loop count is set to zero (0). In block 810, the system's (core's) PLL is warmed up, e.g., for a predetermined time. In block 815, a TAP initialization is conducted. Next, in block 820, the local (i.e., iolb) DLL loop filter is initialized, and in block 825, the DLL is warmed up, e.g., for a predetermined time. In block 830, there is a shift in and/or updating of test data in (TDI) information, e.g., DLL settings such as a desired strobe delay, a data edge type, data pattern, etc.; data generator settings; etc. Again, possible types of settings as well as the value of such settings are dependent upon a platform upon which the present invention is implemented, and should be well within a purview of those skilled in the art. In block 835, waiting is conducted (e.g., for a predetermined time) to allow the DLL to stabilize. In block 840, an iolb mode is enabled, and a loop count is set to one (1). In block 845, an iolb test is conducted for a predetermined amount of time, e.g., x cycles. In block 850, the iolb mode is disabled, the loop count is reset back to zero (0), and per-pin error is latched on a clock falling edge. In block 855, per-pin error is shifted out, e.g., to the chip's core or an external analyzer for error analysis. In decision block 860, a determination is made as to whether additional iolb testing is to be conducted. If yes, operations of the blocks 830 through 855 are again conducted. If no, iolb testing is finished and appropriate items reset, e.g., iolb components deactivated.

Figure 10:
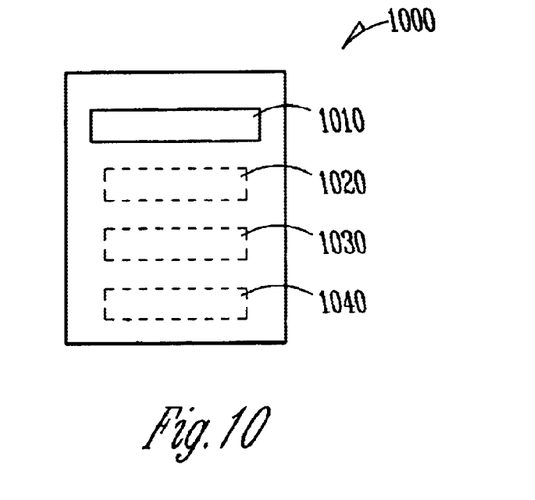
FIG. 10 is an example electronic system that includes an embodiment of the present invention.

In addition to the iolb testing arrangements of the present invention being useful for semiconductor die (e.g., chip) I/O testing during semiconductor manufacture and/or before die release to a purchaser, the iolb testing arrangements may be useful for performing real-time I/O testing within electronic systems in which they are implemented. For instance, FIG. 10 is an example electronic system 1000 that includes an embodiment of the present invention. More particularly, such system 1000 may include: a display 1010; a semiconductor die (e.g., chip) that includes an iolb test embodiment 1030 of the present invention; system memory 1030; and a power supply 1040. The iolb testing may be performed at any predetermined time or times, e.g., upon every startup/initialization of the electronic system; upon user request; at periodic time intervals, etc. Upon detection of an I/O error/fault, the electronic apparatus may be constructed to output a predetermined I/O error/fault indication, e.g., a textual error message on the display 1010.

In concluding, reference in the specification to one embodiment, an embodiment, example embodiment, etc. means that a particular feature, structure or characteristic described in connection with the embodiment is included in at least one embodiment of the invention. The appearance of such phrases at various places in the specification is not necessarily referring to the same embodiment. Further, when a particular feature, structure or characteristic is described in connection with any embodiment, it is within the purview of one skilled in the art to effect such feature structure or characteristic in connection with other ones of the embodiments. Furthermore, for ease of understanding, certain method procedures may have been delineated in separate procedures. However, these separately delineated procedures should not be construed as necessarily order dependent in their performance.

As one example of possible variation, although the terms analogous to "data clock" and "strobe clock" are used as names for the two signals in the example embodiments of the present invention, practice and a scope of the present invention are not limited thereto, i.e., other types of clock names may be used.

This concludes the description of the example embodiments. Although the present invention has been described with reference to a number of illustrative embodiments thereof, it should be understood that numerous other modifications and embodiments can be devised by those skilled in the art.

What is claimed is:

1. A circuit comprising:
an input/output loop-back (iolb) timing-locked-loop (TLL) clock circuit to generate at least a first iolb clock and a second iolb clock having a time-lockable relationship to one another for substantially time-locked iolb travel/capture of test data along at least one iolb path, such time-lockable relationship of the first iolb clock and the second iolb clock being selectably variable to a plurality of differing time-locked relationships to one another during iolb testing.

2. A circuit as claimed in claim 1, where the iolb-TLL clock circuit is one of an iolb phase-locked-loop (iolb-PLL) clock circuit and an iolb delay-locked-loop (iolb-DLL) clock circuit.

3. A circuit as claimed in claim 1, where the first iolb clock is an iolb data clock, and where the second iolb clock is an iolb strobe clock.

4. A circuit as claimed in claim 1, where the time-lockable relationship of the first iolb clock and the second iolb clock are selectably variable to first time-locked relationships to iolb test a rising edge of one of the first iolb clock and the second iolb clock, and selectably variable to second time-locked relationships to iolb test a falling edge of the one of the first iolb clock and the second iolb clock.

5. A circuit as claimed in claim 1, further comprising:
an iolb data path having at least one clocked data output gate to be clocked by the first iolb clock during iolb testing and to output iolb test data to an input/output (I/O) terminal node, and at least one clocked data input gate to be clocked by the second iolb clock and to input the iolb test data back from the I/O terminal node.

6. An iolb test circuit as claimed in claim 5, further comprising:
a plurality of the iolb data paths; and
an iolb data pattern generator to be clocked by the first iolb clock, and to output iolb test bits of iolb test patterns to one or ones of the plurality of the iolb data paths.

7. An iolb test circuit as claimed in claim 1, further comprising:
an iolb data path having at least one clocked data output gate to be clocked by the first iolb clock during iolb testing and to output iolb test data to an input/output (I/O) terminal node, and at least one clocked data input gate to input the iolb test data coming back from the I/O terminal node; and
an iolb strobe path substantially electrically equivalent to at least a majority portion of the iolb data path, the iolb strobe path having at least one clocked strobe output gate to be clocked by the second iolb clock during iolb testing and to output iolb test strobe to an input/output (I/O) strobe terminal node, and at least one input deskew circuit to receive the output iolb test strobe and the iolb test data and to use the received iolb test strobe to supply the iolb test data from the I/O terminal node to the data input gate.

8. A circuit as claimed in claim 7, further comprising:
a plurality of the iolb data paths, and a plurality of iolb strobe paths; and
at least one of:
an iolb data pattern generator to be clocked by the first iolb clock, and to output iolb test bits of iolb test patterns to one or ones of the plurality of the iolb data paths; and an iolb strobe pattern generator to be clocked by the second iolb clock, and to output iolb test strobe bits of iolb test strobe patterns to one or ones of the plurality of the iolb strobe paths.

9. A circuit as claimed in claim 1, where the iolb test circuit is a self-test circuit of a semiconductor die.

10. A circuit as claimed in claim 1, where the first iolb clock and the second iolb clock are in a common clock domain.

11. An electronic system comprising:
   at least one of system memory and a power supply; and
   a circuit having:
      an input/output loop-back (iolb) timing-locked-loop (TLL) clock circuit to generate at least a first iolb clock and a second iolb clock having a time-lockable relationship to one another for substantially time-locked iolb travel/capture of test data along at least one iolb path, such time-lockable relationship of the first iolb clock and the second iolb clock being selectably variable to a plurality of differing time-locked relationships to one another during iolb testing.

12. An electronic system as claimed in claim 11, where the iolb-TLL clock circuit is one of an iolb phase-locked-loop (iolb-PLL) clock circuit and an iolb delay-locked-loop (iolb-DLL) clock circuit.

13. An electronic system as claimed in claim 11, where the first iolb clock is an iolb data clock, and where the second iolb clock is an iolb strobe clock.

14. An electronic system as claimed in claim 11, where the time-lockable relationship of the first iolb clock and the second iolb clock are selectably variable to first time-locked relationships to iolb test a rising edge of one of the first iolb clock and the second iolb clock, and selectably variable to second time-locked relationships to iolb test a falling edge of the one of the first iolb clock and the second iolb clock.

15. An electronic system as claimed in claim 11, further comprising:
   an iolb data path having at least one clocked data output gate to be clocked by the first iolb clock during iolb testing and to output iolb test data to an input/output (I/O) terminal node, and at least one clocked data input gate to be clocked by the second iolb clock and to input the iolb test data back from the I/O terminal node.

16. An electronic system as claimed in claim 15, further comprising:
   a plurality of the iolb data paths; and
   an iolb data pattern generator to be clocked by the first iolb clock, and to output iolb test bits of iolb test patterns to one or ones of the plurality of the iolb data paths.

17. An electronic system as claimed in claim 11, further comprising:
   an iolb data path having at least one clocked data output gate to be clocked by the first iolb clock during iolb testing and to output iolb test data to an input/output (I/O) terminal node, and at least one clocked data input gate to input the iolb test data coming back from the I/O terminal node; and
   an iolb strobe path substantially electrically equivalent to at least a majority portion of the iolb data path, the iolb strobe path having at least one clocked strobe output gate to be clocked by the second iolb clock during iolb testing and to output iolb test strobe to an input/output (I/O) strobe terminal node, and at least one input deskew circuit to receive the output iolb test strobe and the iolb test data and to use the received iolb test strobe to supply the iolb test data from the I/O terminal node to the data input gate.

18. An electronic system as claimed in claim 17, further comprising:
   a plurality of the iolb data paths, and a plurality of iolb strobe paths; and
   at least one of:
      an iolb data pattern generator to be clocked by the first iolb clock, and to output iolb test bits of iolb test patterns to one or ones of the plurality of the iolb data paths; and
      an iolb strobe pattern generator to be clocked by the second iolb clock, and to output iolb test strobe bits of iolb test strobe patterns to one or ones of the plurality of the iolb strobe paths.

19. An electronic system as claimed in claim 11, where the iolb test circuit is a self-test circuit of a semiconductor die.

20. An electronic system as claimed in claim 11, where the first iolb clock and the second iolb clock are in a common clock domain.

21. A method comprising:
   generating, using an input/output loop-back (iolb) timing-locked-loop (TLL) clock circuit, at least a first iolb clock and a second iolb clock having a time-lockable relationship to one another for substantially time-locked iolb travel/capture of test data along at least one iolb path, such time-lockable relationship of the first iolb clock and the second iolb clock being selectably variable to a plurality of differing time-locked relationships to one another during iolb testing.

22. A method as claimed in claim 21, comprising implementing the iolb-TLL clock circuit is one of an iolb phase-locked-loop (PLL) clock circuit and an iolb delay-locked-loop (DLL) clock circuit.

23. A method as claimed in claim 22, where there is a plurality of the iolb data paths, the method further comprising:
   outputting iolb test bits of iolb test patterns from an iolb data pattern generator clocked by the first iolb clock, to one or ones of the plurality of the iolb data paths.

24. A method as claimed in claim 21, comprising varying the time-lockable relationship of the first iolb clock and the second iolb clock to first time-locked relationships to iolb test a rising edge of one of the first iolb clock and the second iolb clock, and to second time-locked relationships to iolb test a falling edge of the one of the first iolb clock and the second iolb clock.

25. A method as claimed in claim 21, comprising implementing the first iolb clock as an iolb data clock, and the second iolb clock as an iolb strobe clock.

26. A method as claimed in claim 21, further comprising:
   outputting iolb test data onto an iolb data path using at least one clocked data output gate clocked by the first iolb clock during iolb testing, to output the iolb test data to an input/output (I/O) terminal node, and inputting the iolb test data coming back from the I/O terminal node along the iolb data path using at least one clocked data input gate clocked by the second iolb clock.

27. A method as claimed in claim 21, further comprising:
   outputting iolb test data onto an iolb data path using at least one clocked data output gate clocked by the first iolb clock during iolb testing, to output the iolb test data to an input/output (I/O) terminal node, and inputting the iolb test data coming back from the I/O terminal node; and
   outputting iolb test strobe onto an iolb strobe path substantially electrically equivalent to at least a majority portion of the iolb data path, using at least one clocked strobe output gate clocked by the second iolb clock during iolb testing, to output the iolb test strobe to an I/O strobe terminal node, and receiving the output iolb test strobe and the iolb test data at at least one input deskew circuit, to use the received iolb test strobe to supply the iolb test data from the I/O terminal node to the data input gate.

28. A method as claimed in claim 27, where there is a plurality of the iolb data paths, the method further comprising at least one of:

outputting iolb test bits of iolb test patterns from an iolb data pattern generator clocked by the first iolb clock, to one or ones of the plurality of the iolb data paths; and outputting iolb test strobe bits of iolb test strobe patterns from an iolb strobe pattern generator clocked by the second iolb clock, to one or ones of the plurality of the iolb strobe paths.

29. A method as claimed in claim 21, comprising implementing the iolb test method as a self-test method implemented for self-test of a semiconductor die.

30. A method as claimed in claim 21, comprising implementing the first iolb clock and the second iolb clock in a common clock domain.

* * * * *